(12) United States Patent
Rizzo et al.

(10) Patent No.: US 7,170,958 B2
(45) Date of Patent: Jan. 30, 2007

(54) METHOD AND APPARATUS FOR ADAPTIVE EQUALIZATION OF HIGH SPEED DATA COMMUNICATIONS

(75) Inventors: Raymond Rizzo, Hillsborough, NC (US); Louis Regniere, Cary, NC (US)

(73) Assignee: Renesas Technology America, Inc., Cypress, CA (US)

( * ) Notice: Subject to any disclaimer, the term of this patent is extended or adjusted under 35 U.S.C. 154(b) by 748 days.

(21) Appl. No.: 10/385,496

(22) Filed: Mar. 12, 2003

(65) Prior Publication Data

US 2004/0179636 A1    Sep. 16, 2004

(51) Int. Cl.
*H04B 1/10* (2006.01)
*H03D 1/06* (2006.01)

(52) U.S. Cl. ............ 375/346; 375/349; 375/350; 455/501

(58) Field of Classification Search ........ 375/346–350, 375/229–236; 329/318–320, 351–333; 455/501
See application file for complete search history.

(56) References Cited

U.S. PATENT DOCUMENTS

| | | | | |
|---|---|---|---|---|
| 4,736,163 A | * | 4/1988 | Berkhout et al. | ............. 327/58 |
| 5,847,600 A | * | 12/1998 | Brooks et al. | ................. 330/9 |
| 5,920,594 A | | 7/1999 | Maeda et al. | |
| 5,987,065 A | | 11/1999 | Candage | |
| 6,166,598 A | * | 12/2000 | Schlueter | .................... 330/127 |
| 6,169,764 B1 | | 1/2001 | Babanezhad | |
| 6,940,916 B1 | * | 9/2005 | Warner et al. | .............. 375/261 |

\* cited by examiner

*Primary Examiner*—Jay K. Patel
*Assistant Examiner*—Curtis B. Odom
(74) *Attorney, Agent, or Firm*—Buchanan Ingersoll & Rooney, PC

(57) ABSTRACT

A method and apparatus are described for adaptively removing interference from a signal. A received signal is amplified linearly along a first signal path to provide a first signal and amplified nonlinearly along a second signal path to provide a second signal. The received signal propagates through the first and second signal paths at substantially the same time. The first and second amplified signals are mixed in proportion according to determined first and second weights, respectively, to provide an output signal having interference removed. The output signal is filtered to produce a first filtered signal corresponding to a ripple envelope of the output signal and filtered substantially simultaneously to produce a second filtered signal corresponding to an average peak detected value of the output signal. The first and second filtered signals are compared to produce an error signal. The first and second weights are determined according to the error signal.

14 Claims, 5 Drawing Sheets

ERROR DETECTOR

MIXER CONTROLLER

METHOD AND APPARATUS FOR ADAPTIVE EQUALIZATION OF HIGH SPEED DATA COMMUNICATIONS

BACKGROUND

The invention relates to data communication. More particularly, the invention relates to a method and system for adaptively removing interference from a received high speed data signal.

It is desirable in high speed data communication to increase the distance the high speed signal travels through transmission media from a transmitter to a receiver. Unfortunately, data signals carried by lossy media such as twisted-pair copper wire, or even fiber optic cable, are subject to amplitude and phase distortions that are frequency and cable length dependent. Moreover, media losses may occur on printed wiring boards due to "skin effect." Uncompensated, such media losses result in both amplitude and timing jitter, such as intersymbol interference (ISI), which imposes practical limitations on the attainable bit error rate (BER) performance, and consequently the link budget. Amplitude and phase equalization is typically employed to correct the distortions at the receiver.

Adaptive receiver equalization systems have been employed to correct distortions or interference in high speed data communications networks such as ATM (155 MBits/s), 100BaseTX Ethernet (100 MBits/s) and FDDI TP-PMD (Twisted-Pair FDDI, 100 Mbits/s).

The prior art systems typically include some kind of variable attenuation, either through amplifiers and/or filters having variable gain, or through a variable attenuator being placed in the path of the signal. These systems have disadvantages from a power usage perspective, since a portion of the received signal is dissipated. Moreover, the prior art systems often require a fixed amplitude reference to control equalization.

For example, U.S. Pat. No. 5,987,065 describes an adaptive equalizer using two high pass filters having variable gain, the output of each connected to one of two respective peak detectors. The outputs of the two peak detectors are compared in a differential amplifier, the output of which is used to control the variable gain of one of the filters. The other filter's gain is held constant to act as a fixed reference for comparison.

Transversal filters, such as the one described in U.S. Pat. No. 5,920,594, have also been described for use in waveform equalization in the prior art. These designs, however, are difficult to implement in practice due to the tight tolerances required for the tap element, the precision required in the digital-to-analog converter, and other factors.

SUMMARY OF THE INVENTION

It should be emphasized that the terms "comprises" and "comprising", when used in this specification as well as the claims, are taken to specify the presence of stated features, steps or components; but the use of these terms does not preclude the presence or addition of one or more other features, steps, components or groups thereof.

Accordingly, method and apparatus are described for adaptively removing interference from a signal. According to exemplary embodiments, a received signal is amplified linearly along a first signal path to provide a first signal and amplified nonlinearly along a second signal path to provide a second signal. The received signal propagates through the first and second signal paths at substantially the same time. The first and second amplified signals are mixed in proportion according to determined first and second weights, respectively, to provide an output signal having interference removed. The output signal is filtered to produce a first filtered signal corresponding to a ripple envelope of the output signal and filtered substantially simultaneously to produce a second filtered signal corresponding to an average peak detected value of the output signal. The first and second filtered signals are compared to produce an error signal. The first and second weights are determined according to the error signal by sampling and holding successive samples of the error signal and comparing the successive samples. The first and second weights are determined according to the results of the comparison.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Various aspects of the invention will now be described in connection with exemplary embodiments. To facilitate an understanding of these embodiments, many aspects are described in terms of sequences of actions that can be performed by elements of a computer system. For example, it will be recognized that in each of the embodiments, the various actions can be performed by specialized circuits or circuitry (e.g., discrete logic gates interconnected to perform a specialized function), by program instructions being executed by one or more processors, or by a combination of both.

Figure 1:
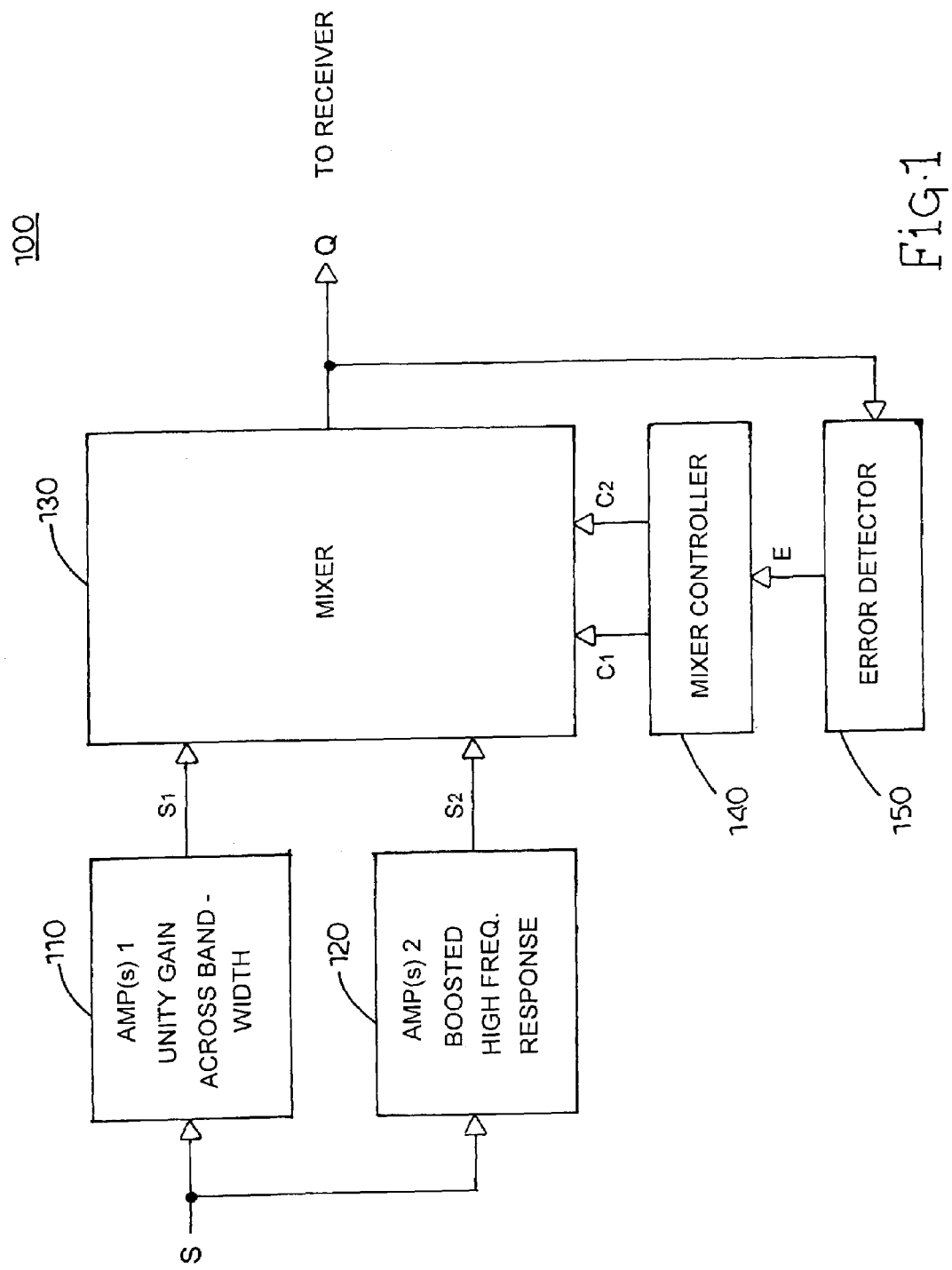
FIG. 1 is a block diagram illustrating a system for adaptively removing interference from a received high speed data signal according to a first embodiment of the invention.

A system for adaptively removing interference from a received high speed data signal according to a first embodiment is shown in FIG. 1. The system includes a first amplifier or amplifier chain (AMP1) 110, a second amplifier or amplifier chain (AMP2) 120, a mixer 130, a mixer controller 140, and an error detector 150. AMP1 110 comprises one or more substantially linear amplifiers connected in a series to amplify a signal with unity gain across the given bandwidth. AMP2 120, on the other hand, comprises one or more substantially nonlinear amplifiers connected in a series to amplify a signal with unity gain at lower frequencies within the given bandwidth and to provide a higher gain at higher frequencies within the given bandwidth. A received signal S is fed into both AMP1 110 and AMP2 120 simultaneously. AMP1 110 and AMP2 120 are matched for propagation delay so that the signal S passes through each respective amplifier or amplifier chain AMP1 110, AMP2

120 and arrives at the mixer 130 as signals $S_1$ and $S_2$ at substantially the same time for practical purposes.

The mixer 130 mixes signals $S_1$ and $S_2$ to produce an output signal Q, which is forwarded to a receiver (not shown) for further processing according to the specific application. More particularly, within the mixer 130, signals $S_1$ and $S_2$ are each weighted individually according to control signals $C_1$ and $C_2$, respectively, and mixed to produce the output signal Q. It has been observed that interference in the received signal, such as ISI, can be adjusted out by adjusting the weight of $S_1$ and $S_2$ accordingly. The control signals $C_1$ and $C_2$ are generated by a mixer controller 140, which is responsive to an error signal E output by an error detector 150, which in turn is responsive to the interference in the received signal.

Figure 2:
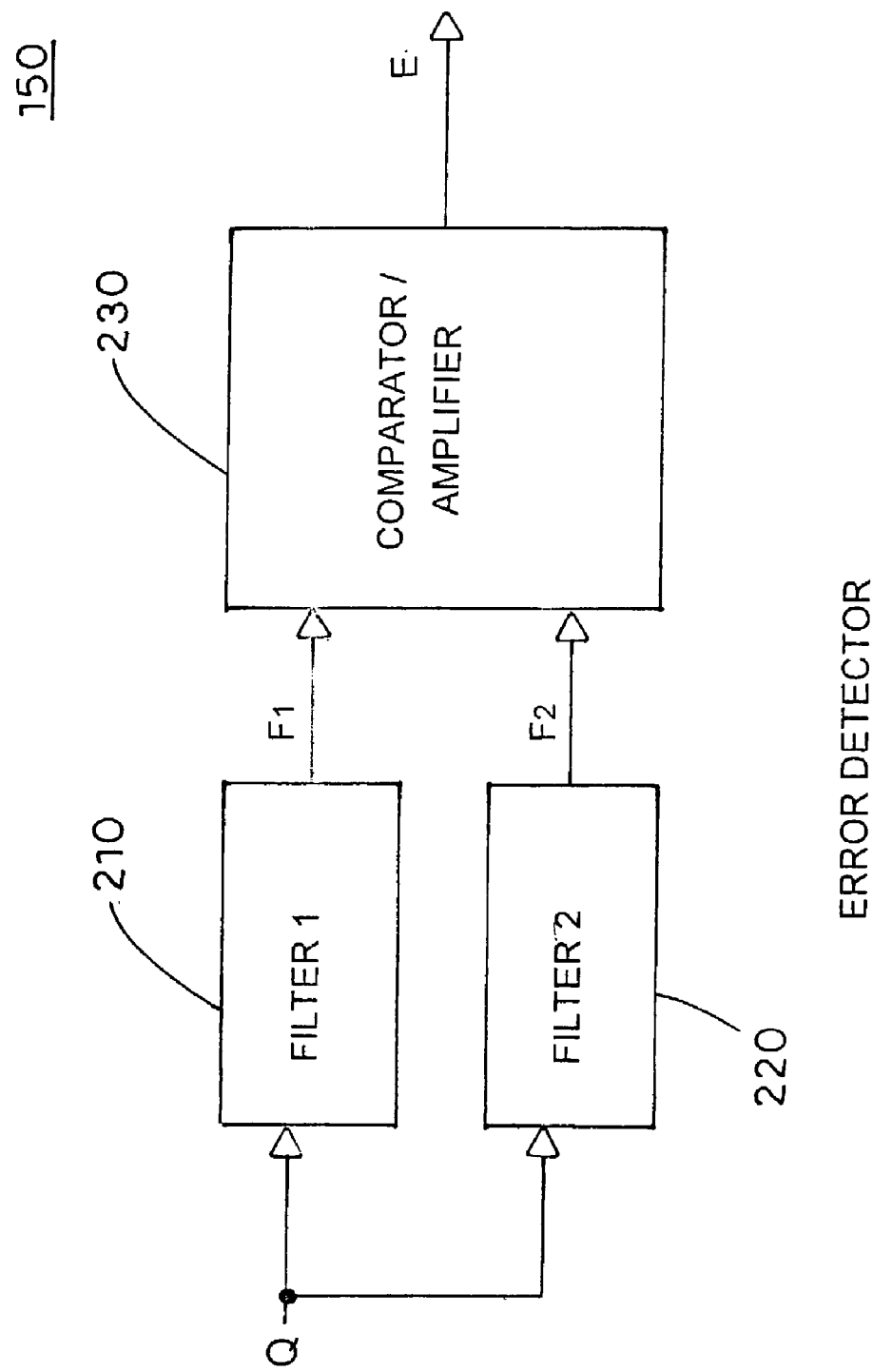
FIG. 2 is a block diagram illustrating an embodiment of an error detector according to the invention.

One embodiment of an error detector 150 according to the invention is illustrated in FIG. 2, which includes first and second filters 210, 220, and a comparator/amplifier 230. The output signal Q from the mixer is provided to the first filter 210 and the second filter 220 for selective filtering to produce two respective filtered signals $F_1$ and $F_2$. Each of the filters 210, 220 are responsive to ripple caused by interference, such as ISI, in the received signal, but in different ways. The first filter 210 is responsive to, i.e., tuned to, the envelope of the ripple caused by the interference, and therefore produces a signal $F_1$ that corresponds to the ripple envelope. The second filter 220 is responsive to the interference ripple peaks and operates to produce a signal $F_2$ that corresponds to an average of the peak detected values of the interference signal. The two signals $F_1$ and $F_2$ are compared and the difference between them is amplified in comparator/amplifier 230 to produce the error signal E, which is proportional to the variance in the envelope of the ripple caused by the interference. Accordingly, as the interference in the signal is adjusted out (as described below), the error signal E gets smaller.

Figure 3:
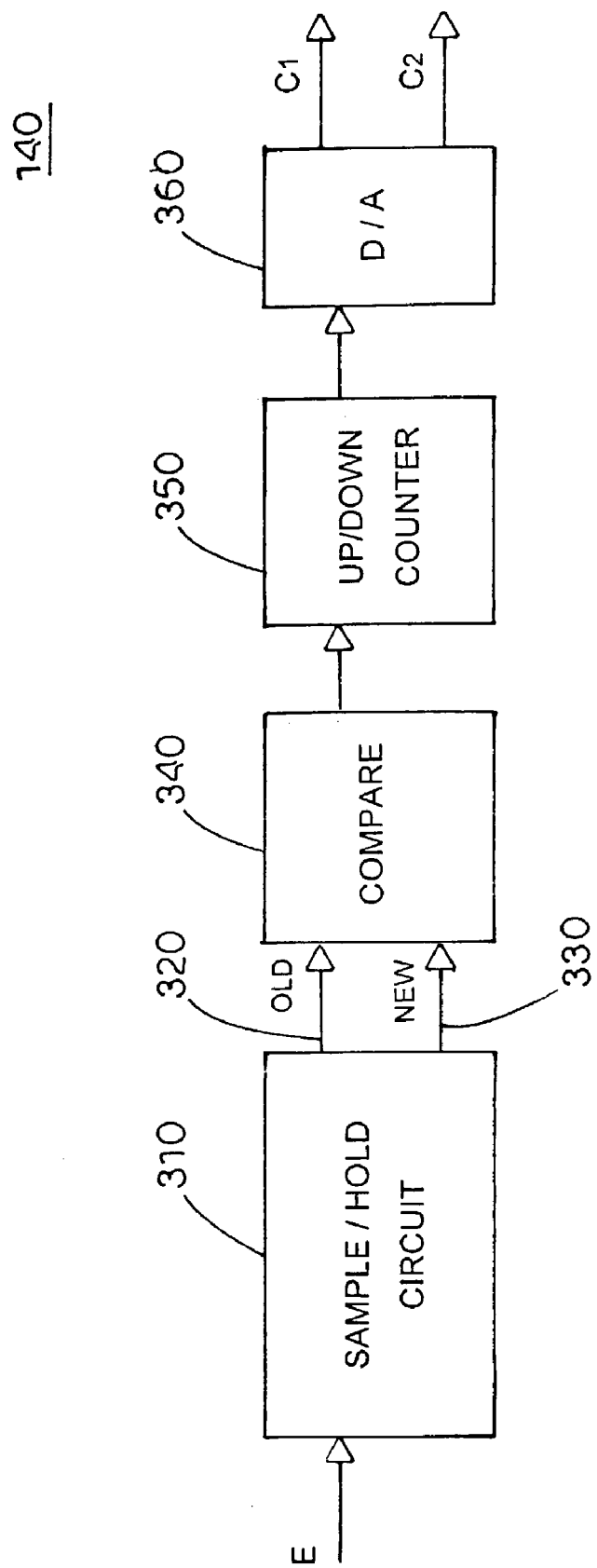
FIG. 3 is a block diagram illustrating an embodiment of a mixer controller according to the invention.

Once the proportional error signal E is produced, the mixer 130 can adjust the weights of signals $S_1$ and $S_2$ appropriately to adjust out the interference. One embodiment of a mixer controller 140 according to the invention is illustrated in FIG. 3, which includes a sample and hold circuit 310, a comparator 340, a counter 350, and a D/A (digital-to-analog) converter 360. A sample and hold circuit 310 operates to periodically sample and store at least two samples of the error signal E each taken at different times. More particularly, each time a sample of E is taken, the sample is stored as a "new" sample and the previously stored sample becomes an "old" sample. The sample and hold circuit 310 takes samples periodically, for example as triggered by a clock signal from a low frequency oscillator.

With each clock cycle, a new sample is taken and the sample and hold circuit 310 provides the new sample's error value 330 and the old sample's error value 320 to the comparator 340 for comparison. Here, the representative error value that is used in comparison can be any value indicative of the change in the energy of the error signal. For example, the error value can be a voltage, a current, or a power value. The counter 350 is incremented or decremented according to the results of the comparison as determined from a signal provided by the comparator 340 to the counter 350. The new value of the counter 350 is provided to the D/A converter 360 with each clock cycle.

The D/A converter 360 produces an analog control signal $C_1$ having a current incrementally proportional to the value, e.g., binary value, in the counter 350 and an analog control signal $C_2$ having a current that incrementally decreases as $C_1$ increases, such that the current of $C_1+C_2$ is substantially constant. For example, where a 4-bit counter is used, having binary values from 0–15, there are 16 incremental unit values k of current to be output by the D/A converter 360 that correspond to the 16 binary values of the counter. As the counter value increases, the $C_1$ current value $C_1(k)$ increases and $C_2$ current value $C_2(k)$ decreases, where $C_1(k)+C_2(k) =16$ k. Thus, as a form of shorthand, $C_1$ and $C_2$ will be described herein as being "complimentary" signals, which will refer to the above relation. In operation, control signals $C_1$ and $C_2$ provide feedback to the mixer 130 that corresponds to a change in the error signal E. The value of control signals $C_1$ and $C_2$ respectively correspond to the desired weight of signals $S_1$ and $S_2$ so that the mixer 130 can adjust the relative weights of $S_1$ and $S_2$ until the error signal E is minimized. More particularly, there are incremental unit weight values that correspond to each of the incremental unit values k of current.

Figure 4:
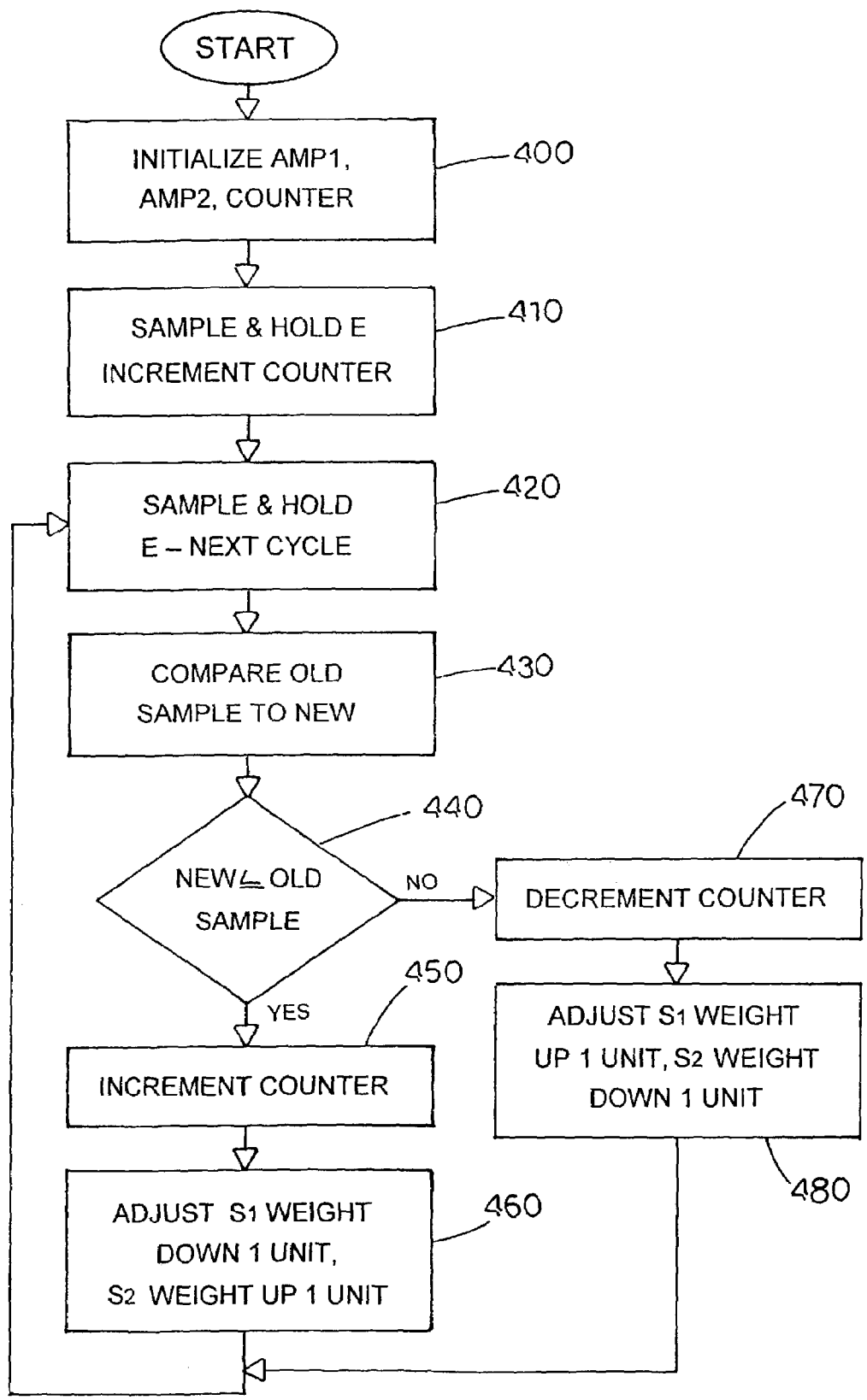
FIG. 4 is a flow chart illustrating a method for adaptive equalization according to an embodiment of the invention.

The process for minimizing E is described further with reference to FIG. 4, which is one embodiment of a method for adaptive equalization according to the invention. The amplifiers and counters are first initialized such that signal $S_1$ from AMP1 110 is given the maximum allowable weight by the mixer 130 within the parameters of the system, signal $S_2$ from AMP2 120 is given the minimum allowable weight by the mixer 130 within the parameters of the system, and the counter 350 is set to zero (step 400). An initial sample of the error signal E is taken by the sample and hold circuit 310 and the counter is incremented to 1 (step 410).

During the next cycle, as determined for example by a low frequency clock signal, a new sample of the error signal E is taken by the sample and hold circuit 310 (step 420), and the initial sample becomes the old sample. The old sample's error value 320 and new sample's error value 330 are compared in comparator 340 (step 430). The comparator 340 provides either an increment or a decrement signal to the counter 350 based on the results of the comparison. If the new sample's error value 330 is less than or equal to the old sample's error value 320 (step 440), then an increment signal is provided to the counter 350 and the counter 350 is incremented in response (step 450). If, on the other hand, the new sample's error value 330 is greater than the old sample's error value 320 (step 440), then a decrement signal is provided to the counter 350 and the counter 350 is decremented in response (step 470).

In either case, the new value in the counter is provided to the D/A converter 360 and corresponding control signals $C_1$ and $C_2$ are produced, which have complimentary current values proportional to the counter's value, as described above. The control signals $C_1$ and $C_2$ provide an indication to the mixer 130 for adjusting the weight of each of signals $S_1$ and $S_2$. More particularly, the weight given to signal $S_1$ increases and decreases as the value of $C_1$ increases and decreases and the weight given to signal $S_2$ increases and decreases as the value of $C_2$ increases and decreases. The values of both $C_1$ and $C_2$ will change each time the counter's value is changed, since they are complimentary values.

Referring again to FIG. 4, the interference is known to be decreasing when the new sample's error value 330 is less than or equal to the old sample's error value 320 (step 440). In such a case, the counter is incremented (step 450) and the weight of $S_1$ is decreased one incremental unit weight value while the weight of $S_2$ is increased one incremental unit weight value (step 460). Inversely, the interference is known to be increasing when the new sample's error value 330 is greater than the old sample's error value 320 (step 440). In such a case, the counter is decremented (step 450) and the weight of $S_1$ is increased one incremental unit weight value while the weight of $S_2$ is decreased one incremental unit weight value (step 480). In either case, the procedure is repeated (returning to step 420) to obtain a new sample of the error signal E at the sample and hold circuit 310 on the next cycle.

Figure 5:
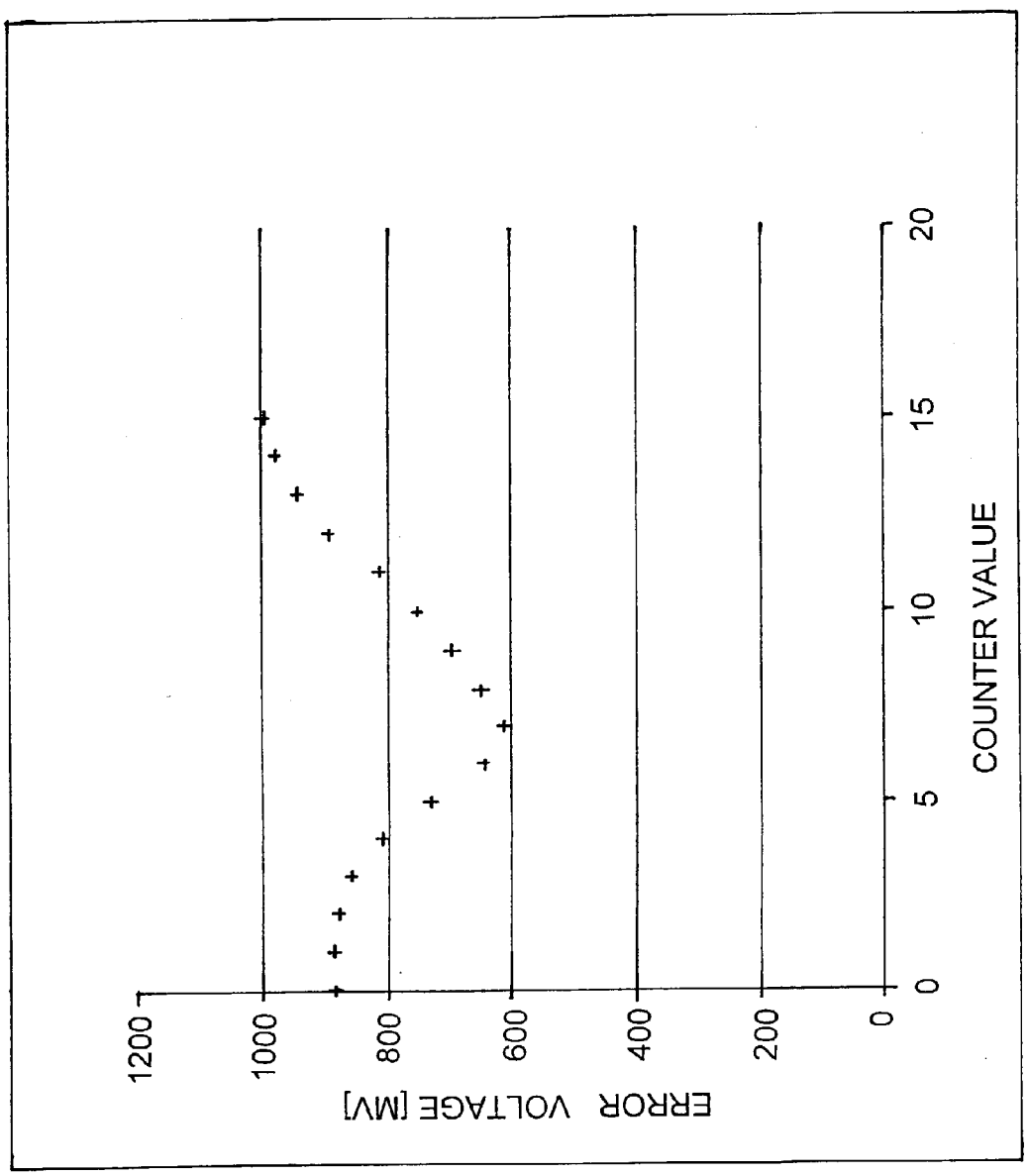
FIG. 5 is a graph of error voltage E as a function of the counter value according to an embodiment of the invention.

By adaptively adjusting the relative weights of the linear and nonlinear components of the received signal as described above, the received signal is reproduced such that an optimal signal having minimal interference is provided to the receiver. For example, as illustrated in the graph of FIG. 5, which shows the error voltage E as a function of the counter value, the error voltage E is minimized to 600 mV when counter 350 reaches the optimal counter value of 6 units. Therefore, in this example, the weight of $S_1$ and $S_2$ is adaptively optimized when the values of $C_1$ and $C_2$ that correspond to a counter value of 6 are input to the mixer 130 at that particular point in time.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A method of adaptively removing interference from a signal, comprising the steps of;
   (a) amplifying a received signal linearly along a first signal path to provide a first signal;
   (b) amplifying the received signal nonlinearly along a second signal path to provide a second signal, the received signal propagating through the first and second signal paths at substantially the same time;
   (c) mixing the first and second amplified signals in proportion according to determined first and second weights, respectively, to provide an output signal having interference removed, said first and second weights being set to an initial value prior to their determination;
   (d) filtering the output signal to produce a first filtered signal corresponding to a ripple envelope of the output signal;
   (e) filtering the output signal to produce a second filtered signal corresponding to an average peak detected value of the output signal;
   (f) comparing the first and second filtered signals to produce an error signal;
   (g) determining the first and second weights according to the error signal; and
   (h) repeating steps (a) thru (g).

2. The method of claim 1, wherein step (b) comprises amplifying the received signal with unity gain at lower frequencies within a given frequency bandwidth and higher gain at higher frequencies within the given frequency bandwidth.

3. The method of claim 2, wherein step (a) comprises amplifying the received signal with unity gain across the given frequency bandwidth.

4. The method of claim 1, wherein step (g) comprises the steps of:
   sampling and holding first and second successive samples of the error signal;
   comparing the first and second successive samples; and
   determining the first and second weights according to the comparison.

5. The method of claim 4, wherein the step of determining the first and second weights comprises the steps of:
   incrementing or decrementing a counter value according to the results of the comparison; and
   converting the counter value to first and second weight control signals corresponding to the first and second weights, said first and second weight signals being complementary.

6. An apparatus for adaptively removing interference from a signal, comprising:
   a first amplifier chain comprising one or more linear amplifiers that amplify a received signal to provide a first signal;
   a second amplifier chain comprising one or more non linear amplifiers that amplify the received signal to provide a second signal, the received signal propagating through the first and second amplifier chains at substantially the same time;
   a mixer that receives and mixes the first and second amplified signals in proportion according to determined first and second weights, respectively, to provide an output signal having interference removed, said first and second weights being set to an initial value prior to their determination;
   a first filter that filters the output signal to produce a first filtered signal corresponding to a ripple envelope of the output signal;
   a second filter that filters the output signal to produce a second filtered signal corresponding to an average peak detected value of the output signal;
   a comparator that compares the first and second filtered signals to produce an error signal; and
   a mixer controller that determines the first and second weights according to the error signal and provides respective first and second control signals to the mixer.

7. The apparatus of claim 6, wherein the second amplifier chain amplifies the received signal with unity gain at lower frequencies within a given frequency bandwidth and higher gain at higher frequencies within the given frequency bandwidth.

8. The apparatus of claim 7, wherein the first amplifier chain amplifies the received signal with unity gain across the given frequency bandwidth.

9. The apparatus of claim 6, wherein the mixer controller comprises:
   a sample and hold circuit that samples and holds first and second successive samples of the error signal;
   a comparator that compares the first and second successive samples;
   a counter that increments or decrements a counter value according to the results of the comparison; and
   an digital-to-analog converter for converting the counter value to first and second weight control signals corresponding to the first and second weights, said first and second weight signals being complementary.

10. An apparatus for adaptively removing interference from a signal, comprising;
    means for amplifying a received signal linearly along a first signal path to provide a first signal;
    means for amplifying the received signal nonlinearly along a second signal path to provide a second signal, the received signal propagating through the first and second signal paths at substantially the same time;
    means for mixing the first and second amplified signals in proportion according to determined first and second weights, respectively, to provide an output signal having interference removed, said first and second weights being set to an initial value prior to their determination;

means for filtering the output signal to produce a first filtered signal corresponding to a ripple envelope of the output signal;

means for filtering the output signal to produce a second filtered signal corresponding to an average peak detected value of the output signal;

means for comparing the first and second filtered signals to produce an error signal; and means for determining the first and second weights according to the error signal.

11. The apparatus of claim 10, wherein the means for amplifying the received signal nonlinearly amplifies the received signal with unity gain at lower frequencies within a given frequency bandwidth and at higher gain at higher frequencies within the given frequency bandwidth.

12. The apparatus of claim 11, wherein the means for amplifying the received signal linearly amplifies the received signal with unity gain across the given frequency bandwidth.

13. The apparatus of claim 1, wherein means for determining the first and second weights comprises:

means for sampling and holding first and second successive samples of the error signal;

means for comparing the first and second successive samples; and means for determining the first and second weights according to the comparison.

14. The apparatus of claim 13, wherein the means for determining the first and second weights according to the comparison comprises:

means for storing and periodically incrementing or decrementing a counter value according to the results of the comparison; and means for converting the counter value to first and second weight control signals corresponding to the first and second weights, said first and second weight signals being complementary.

* * * * *